(12) United States Patent
Tamaso et al.

(10) Patent No.: US 9,384,981 B2
(45) Date of Patent: Jul. 5, 2016

(54) METHOD OF MANUFACTURING SILICON CARBIDE SEMICONDUCTOR DEVICE

(71) Applicant: Sumitomo Electric Industries, Ltd., Osaka-shi (JP)

(72) Inventors: Hideto Tamaso, Osaka (JP); Hiroyuki Kitabayashi, Osaka (JP); Keiji Wada, Osaka (JP)

(73) Assignee: Sumitomo Electric Industries, Ltd., Osaka-shi (JP)

(*) Notice: Subject to any disclaimer, the term of this patent is extended or adjusted under 35 U.S.C. 154(b) by 0 days.

(21) Appl. No.: 14/794,600

(22) Filed: Jul. 8, 2015

(65) Prior Publication Data

US 2016/0056041 A1 Feb. 25, 2016

(30) Foreign Application Priority Data

Aug. 20, 2014 (JP) ................. 2014-167529

(51) Int. Cl.
| | |
|---|---|
| *H01L 21/00* | (2006.01) |
| *H01L 21/04* | (2006.01) |
| *H01L 21/268* | (2006.01) |
| *H01L 21/285* | (2006.01) |
| *H01L 21/304* | (2006.01) |
| *H01L 29/16* | (2006.01) |
| *H01L 29/45* | (2006.01) |

(52) U.S. Cl.
CPC ........ *H01L 21/0485* (2013.01); *H01L 21/0475* (2013.01); *H01L 21/268* (2013.01); *H01L 21/28568* (2013.01); *H01L 21/304* (2013.01); *H01L 29/1608* (2013.01); *H01L 29/45* (2013.01)

(58) Field of Classification Search
CPC ............ H01L 21/0485; H01L 21/0475; H01L 21/268; H01L 21/28568
See application file for complete search history.

(56) References Cited

U.S. PATENT DOCUMENTS

| | | | | |
|---|---|---|---|---|
| 5,323,022 A | * | 6/1994 | Glass ................. | H01L 21/0485 257/734 |
| 5,980,265 A | * | 11/1999 | Tischler ............. | H01L 21/0485 148/DIG. 148 |
| 2012/0319135 A1 | | 12/2012 | Tamaso | |

FOREIGN PATENT DOCUMENTS

JP 2012-099598 A 5/2012

\* cited by examiner

*Primary Examiner* — Richard Booth
(74) *Attorney, Agent, or Firm* — Venable LLP; Michael A. Sartori

(57) ABSTRACT

A method of manufacturing a silicon carbide semiconductor device includes the steps of preparing a silicon carbide substrate, forming a first electrode on the silicon carbide substrate, establishing ohmic contact between the silicon carbide substrate and the first electrode by irradiating the first electrode with laser beams, and forming a second electrode on the first electrode. In the step of establishing ohmic contact, a surface of the first electrode is irradiated with laser beams such that arithmetic mean roughness of a surface of the second electrode is not greater than 0.2 μm.

6 Claims, 6 Drawing Sheets

2

METHOD OF MANUFACTURING SILICON CARBIDE SEMICONDUCTOR DEVICE

BACKGROUND OF THE INVENTION

1. Field of the Invention

The present disclosure relates to a method of manufacturing a silicon carbide semiconductor device.

2. Description of the Background Art

Japanese Patent Laying-Open No. 2012-99598 discloses a method of forming an electrode layer.

SUMMARY OF THE INVENTION

A method of manufacturing a silicon carbide semiconductor device according to one embodiment of the present disclosure includes the steps of preparing a silicon carbide substrate, forming a first electrode on the silicon carbide substrate, establishing ohmic contact between the silicon carbide substrate and the first electrode by irradiating the first electrode with laser beams, and forming a second electrode on the first electrode. In the step of establishing ohmic contact, a surface of the first electrode is irradiated with laser beams such that arithmetic mean roughness of a surface of the second electrode is not greater than 0.2 μm.

DETAILED DESCRIPTION OF THE INVENTION

Figure 1:
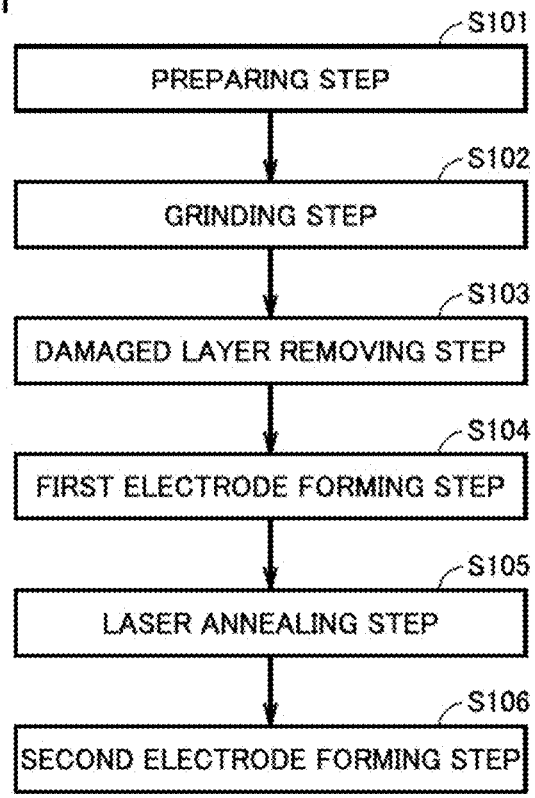
FIG. 1 is a flowchart showing overview of a manufacturing method according to one embodiment of the present disclosure.

For manufacturing a silicon carbide (SiC) semiconductor device, a method of establishing ohmic contact between an SiC substrate and an electrode layer through laser annealing has been known.

Japanese Patent Laying-Open No. 2012-99598 discloses a method of forming an electrode layer which is in ohmic contact with an SiC substrate by forming a material layer having nickel (Ni) atoms and silicon (Si) atoms on the SiC substrate and annealing the material layer with laser beams. The electrode layer in ohmic contact with the substrate is also called an ohmic electrode.

According to Japanese Patent Laying-Open No. 2012-99598, since laser annealing requires a shorter time period for annealing than lamp annealing, diffusion of carbon (C) atoms in the SiC substrate to an outermost surface of the electrode layer and segregation thereof at the outermost surface can be suppressed and hence a metal electrode for mounting which is formed thereon can be less likely to peel off.

A metal electrode for mount is also called a pad electrode. When a surface of the pad electrode is rough, solderability is lowered and voids are generated during die bonding. A semiconductor device in which ohmic contact is established through lamp annealing has conventionally been less likely to suffer from surface roughness of a pad electrode. Currently, however, in a semiconductor device in which ohmic contact is established through laser annealing, surface roughness of the pad electrode has become noticeable, and defective mounting due to voids has resulted in lower yields. Decrease in surface roughness per se by subjecting the pad electrode to polishing or the like is possible. In that case, however, the number of processes and cost may increase.

Therefore, an object is to suppress generation of voids during die bonding by forming a pad electrode such that surface roughness is lessened.

DESCRIPTION OF EMBODIMENTS OF THE PRESENT DISCLOSURE

Embodiments of the present disclosure will initially be listed and explained. The same or corresponding elements in the description below have the same reference characters allotted and the same description thereof will not be repeated. "Arithmetic mean roughness" herein represents arithmetic mean roughness (Ra) defined under "JIS B 0601:2001".

[1] A method of manufacturing a silicon carbide semiconductor device according to one embodiment of the present disclosure includes the steps of preparing a silicon carbide substrate 100 (S101), forming a first electrode 110 on silicon carbide substrate 100 (S104), establishing ohmic contact between silicon carbide substrate 100 and first electrode 110 by irradiating first electrode 110 with laser beams (S105), and forming a second electrode 120 on first electrode 110 (S106). In the step of establishing ohmic contact (S105), a surface S1 of first electrode 110 is irradiated with laser beams such that arithmetic mean roughness of a surface S2 of second electrode 120 is not greater than 0.2 μm.

As a result of dedicated studies conducted by the present inventor for solving the problems above, it has newly been found that surface roughness of second electrode 120 (a pad electrode) formed on first electrode 110 can be controlled by adjusting a condition for laser annealing in establishing ohmic contact of first electrode 110 (an ohmic electrode) with SiC substrate 100. Therefore, in the manufacturing method above, ohmic contact between SiC substrate 100 and first electrode 110 is established by irradiating surface S1 of first electrode 110 with laser beams such that arithmetic mean roughness of surface S2 of second electrode 120 is not greater than 0.2 μm.

Details of a mechanism allowing control of surface roughness of second electrode 120 depending on a condition for laser annealing are currently not clear. Roughness at surface S1 of first electrode 110 (that is, a surface on which second electrode 120 is to be formed) after laser annealing is much smaller than roughness at surface S2 of second electrode 120, and the former does not necessarily correspond to the latter. Therefore, it cannot be concluded that roughness at surface S1 of first electrode 110 is controlled simply based on a condition for laser annealing.

Figure 12:
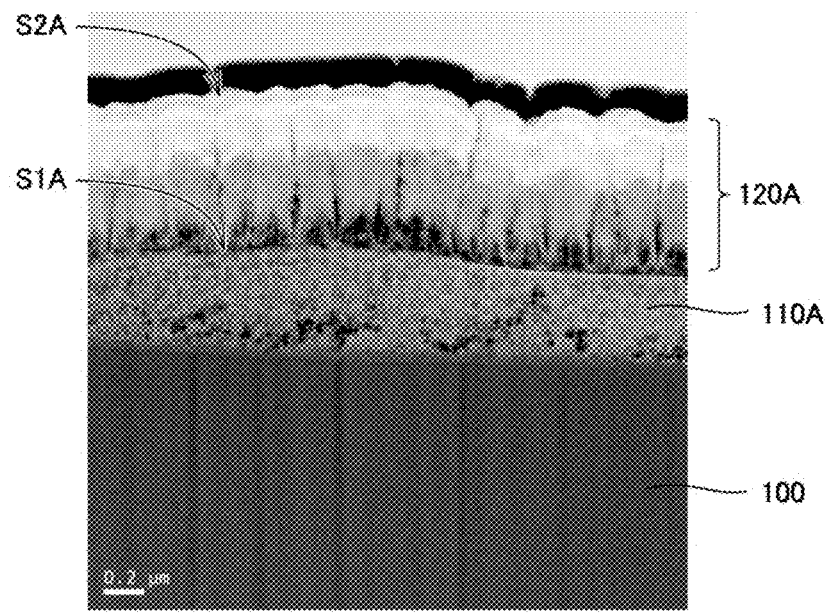
FIG. 12 is an HAADF-STEM image showing one example of a cross-section of an ohmic electrode and a pad electrode in a silicon carbide semiconductor device according to a reference example.

FIG. 12 is a high angle annular dark field-scanning transmission electron microscope (HAADF-STEM) image showing one example of a cross-section of an ohmic electrode 110A and a pad electrode 120A in a silicon carbide semiconductor device according to a reference example. In this reference example, a surface S1A of ohmic electrode 110A is irradiated with laser beams at laser irradiation intensity of 2.7 J/cm$^2$. As can be seen in FIG. 12, despite the fact that surface S1A of ohmic electrode 110A is substantially flat, large roughness is formed at a surface S2A of pad electrode 120A formed thereon and the former does not correspond in shape to the latter.

The present inventor estimates reasons for occurrence of such a phenomenon as follows. Though depending on specifications of a device, in lamp annealing, heat is evenly applied to an area of approximately several mm square. In contrast, laser beams used in laser annealing for establishing ohmic contact are normally pulsed, and hence emitted energy within a spot diameter of laser beams (approximately from several ten μm to several hundred μm) is varied. Therefore, it is expected that periodic variation in irradiation is caused at micro intervals at a surface of an electrode subjected to laser annealing. It is estimated that this variation in irradiation has caused periodic change in physical properties or in composition at surface S of first electrode 110 even though such variation does not lead to change in physical shape (roughness). It is expected that, when a metal which will form second electrode 120 is deposited, for example, with sputtering, on a base having such periodic change in physical properties and others, local variation in growth of the metal takes place in an in-plane direction and consequently surface roughness of second electrode 120 is caused.

Figure 13:
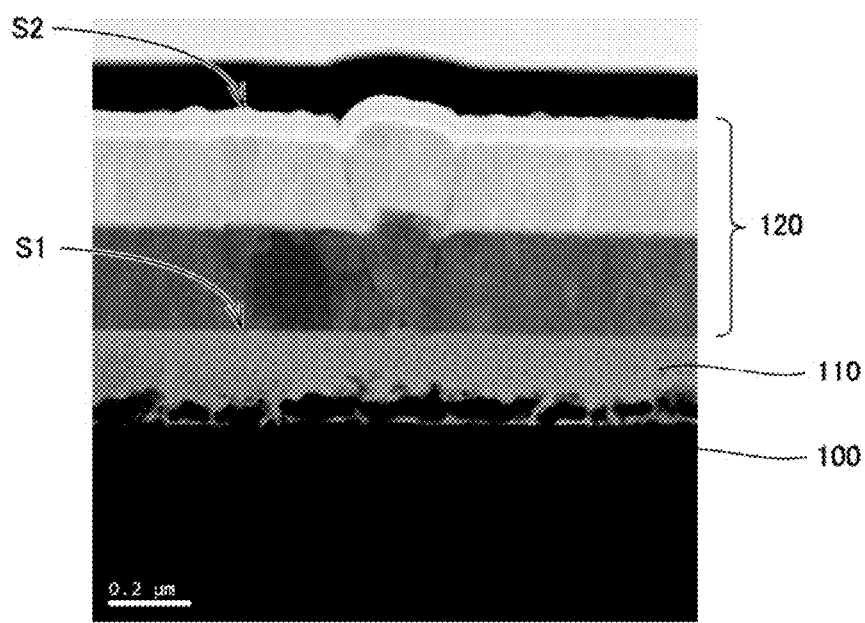
FIG. 13 is an HAADF-STEM image showing one example of a cross-section of a first electrode and a second electrode in the silicon carbide semiconductor device according to one embodiment of the present disclosure.

FIG. 13 is an HAADF-STEM image showing a cross-section of first electrode 110 and second electrode 120 in a silicon carbide semiconductor device obtained with the manufacturing method according to one embodiment of the present disclosure. In this example, surface S1 of first electrode 110 is irradiated with laser beams at laser irradiation intensity of 1.9 J/cm$^2$. In FIG. 13, surface S1 of first electrode 110 is not much different in shape from surface S1A (see FIG. 12) of ohmic electrode 110A described previously. Arithmetic mean roughness (Ra) of surface S2 of second electrode 120 formed thereon, however, is not greater than 0.2 μm, which is significantly different from that of surface S2A (see FIG. 12) of pad electrode 120A. Namely, in this example, surface S1 of first electrode 110 is irradiated with laser beams such that arithmetic mean roughness of surface S2 of second electrode 120 is not greater than 0.2 μm. As will be described later, when arithmetic mean roughness of surface S2 of second electrode 120 is not greater than 0.2 μm, generation of voids can be lessened during die bonding.

[2] Preferably, first electrode 110 contains nickel (Ni). As first electrode 110 contains Ni, electrical resistance can be lowered.

[3] Preferably, second electrode 120 contains gold (Au). As second electrode 120 contains Au, electrical resistance can be lowered.

[4] Preferably, second electrode 120 includes a plurality of layers, and the plurality of layers include a first layer 121 containing titanium, a second layer 122 containing nickel, and a third layer 123 containing gold. By adopting such a stack structure for second electrode 120, electrical resistance can be lowered.

[5] Preferably, the manufacturing method in [1] above further includes, before the step of forming first electrode 110, the steps of grinding a main surface P2 of silicon carbide substrate 100 on which first electrode 110 is to be formed (S102) and removing a damaged layer by etching ground main surface P2 (S103), and in the step of establishing ohmic contact (S105), surface S1 of first electrode 110 is irradiated with laser beams at laser irradiation intensity not lower than 1.5 J/cm$^2$ and not higher than 2.4 J/cm$^2$.

By forming first electrode 110 on main surface P2 subjected to such pre-processing and further carrying out laser annealing at laser irradiation intensity not lower than 1.5 J/cm$^2$ and not higher than 2.4 J/cm$^2$, arithmetic mean roughness (Ra) of surface S2 of second electrode 120 can be lowered and generation of voids during die bonding can be suppressed while ohmic contact between SiC substrate 100 and first electrode 110 is established.

"Laser irradiation intensity" herein refers to an energy density at the time when a range of laser output up to the laser output reaching a value 1/e times as great as a peak value ("e" representing a Napier's constant) is defined as a laser irradiation range and it is assumed that 100% of laser energy is included within that irradiation range.

[6] Preferably, first electrode 110 contains silicon (Si). As first electrode 110 contains Si, diffusion of C from SiC substrate 100 can be suppressed. An electrode in ohmic contact with SiC substrate 100 can also be formed without receiving supply of Si from SiC substrate 100.

DETAILS OF EMBODIMENTS OF THE PRESENT DISCLOSURE

One embodiment of the present disclosure (hereinafter also denoted as the "present embodiment") will be described hereinafter in detail, however, the present embodiment is not limited thereto FIG. 1 is a flowchart showing overview of the manufacturing method according to the present embodiment. Referring to FIG. 1, the manufacturing method includes a preparing step (S101), a grinding step (S102), a damaged layer removing step (S103), a first electrode forming step (S104), a laser annealing step (S105), and a second electrode forming step (S106). The present embodiment will be described hereinafter with reference to a vertical metal oxide semiconductor field effect transistor (MOSFET) by way of example.

[Silicon Carbide Semiconductor Device]

Figure 6:
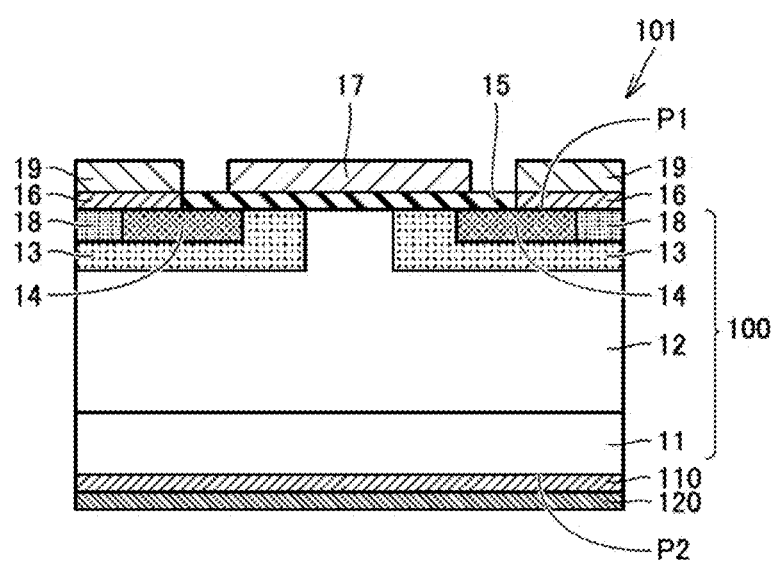
FIG. 6 is a schematic cross-sectional view showing one example of a construction of a silicon carbide semiconductor device according to one embodiment of the present disclosure.

A silicon carbide (SiC) semiconductor device manufactured according to the present embodiment will initially be described. FIG. 6 is a schematic cross-sectional view showing one example of a construction of an SiC semiconductor device 101. SiC semiconductor device 101 is a vertical MOSFET having a planar structure. SiC semiconductor device 101 includes SiC substrate 100 having a first main surface P1 and second main surface P2 located opposite to first main surface P1. SiC substrate 100 includes an SiC layer 11 and an epitaxial layer 12. SiC layer 11 and epitaxial layer 12 have, for example, an n conductivity type.

Epitaxial layer 12 is a semiconductor layer epitaxially grown on SiC layer 11 and has various impurity regions (a body region 13, an n+ region 14, a contact region 18). On epitaxial layer 12, a gate insulating film 15, a gate electrode 17, a source electrode 16, and a front-surface-side pad electrode 19 are formed.

On second main surface P2 (a backside surface), first electrode 110 (ohmic electrode) in ohmic contact with second main surface P2 and second electrode 120 (pad electrode) formed on first electrode 110 are formed. In SiC semiconductor device 101, first electrode 110 and second electrode 120 function as a drain electrode. The present embodiment will be described hereinafter, with a method of forming first electrode 110 and second electrode 120 mainly being focused on.

[Preparing Step (S101)]

Figure 2:
FIG. 2 is a schematic partial cross-sectional view illustrating a preparing step according to one embodiment of the present disclosure.

FIG. 2 is a schematic partial cross-sectional view illustrating the preparing step (S101). FIG. 2 has a vertical direction inverted as compared with FIG. 6 described previously. In the preparing step (S101), SiC substrate 100 is prepared. As described previously, SiC substrate 100 includes second main surface P2. Here, second main surface P2 is a main surface where first electrode 110 is to subsequently be formed. In this step, various impurity regions or electrodes described previously may be formed on a side of first main surface P1.

[Grinding Step (S102)]

In the grinding step (S102), second main surface P2 is ground. By decreasing a thickness of SiC substrate 100 by grinding SiC substrate 100 from a side of second main surface P2, a resistive component derived from a thickness of the SiC substrate can be reduced and first electrode 110 can more uniformly be formed. A general grinding apparatus (a grinder) can be employed for grinding.

[Damaged Layer Removing Step (S103)]

As second main surface P2 is mechanically ground with a grinder or the like, a damaged layer where crystal structure has altered is generated to a certain depth from second main surface P2. The damaged layer may also be called a process-affected layer. The damaged layer is a layer different in physical properties from SiC (a base material) and less likely to establish ohmic contact with first electrode 110 than the base material. Therefore, in the present embodiment, such a damaged layer is etched away. The damaged layer can be removed, for example, with such dry etching as reactive ion etching (RIE).

[First Electrode Forming Step (S104)]

Figure 3:
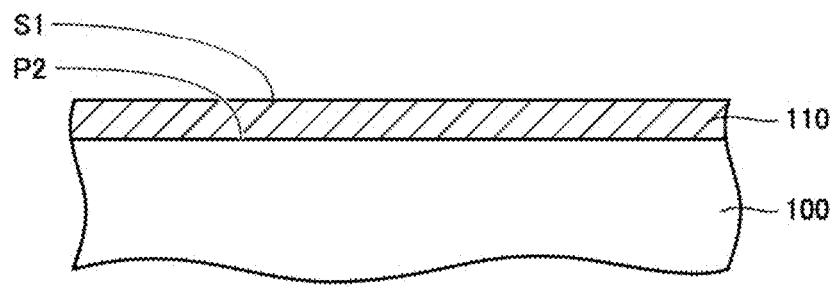
FIG. 3 is a schematic partial cross-sectional view illustrating a first electrode forming step according to one embodiment of the present disclosure.

FIG. 3 is a schematic partial cross-sectional view illustrating the first electrode forming step (S104). In the first electrode forming step (S104), first electrode 110 which is an ohmic electrode is formed. First electrode 110 is formed on second main surface P2. First electrode 110 can be formed, for example, with sputtering or vacuum vapor deposition. First electrode 110 has a thickness, for example, approximately from 50 to 150 nm.

An element forming first electrode 110 can be exemplified by Ni, titanium (Ti), tungsten (W), and molybdenum (Mo). First electrode 110 preferably contains Ni among them. Thus, electrical resistance can be lowered. First electrode 110 may be composed of a single element or of a plurality of elements. For example, first electrode 110 may be composed of Ni and Si. As first electrode 110 contains Si, diffusion of C from SiC substrate 100 can be suppressed and electrical resistance can be lowered. In first electrode 110, Ni and Si may be in a state of a mixture, or may form an intermetallic compound such as nickel silicide (NiSi).

When first electrode 110 contains Ni and Si, the number of atoms of Ni particularly preferably occupies 70% or more of the total number of atoms of Ni and Si. First electrode 110 having such composition can be expected to be lower in electrical resistance. Here, a ratio of the number of atoms of Ni is desirably not higher than 90%, in order to suppress diffusion of C from SiC substrate 100. An atomic concentration can be measured, for example, with energy dispersive X-ray spectrometry (EDX) or secondary ion mass spectrometry (SIMS). First electrode 110 may contain an impurity inevitably introduced during formation.

[Laser Annealing Step (S105)]

Figure 4:
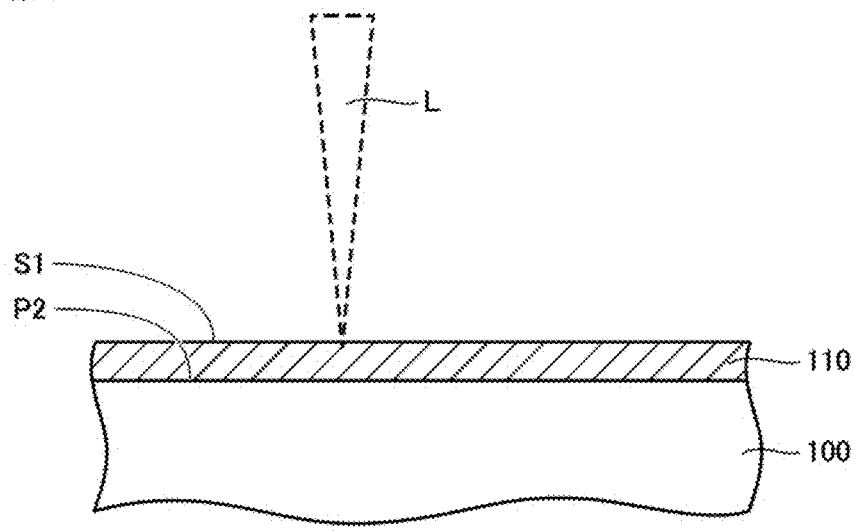
FIG. 4 is a schematic partial cross-sectional view illustrating a laser annealing step according to one embodiment of the present disclosure.

FIG. 4 is a schematic partial cross-sectional view illustrating the laser annealing step (S105). In the laser annealing step (S105), ohmic contact between SiC substrate 100 and first electrode 110 is established with the use of laser beams L. Desirably, an atmosphere of an inert gas (such as argon) is adopted as an atmosphere for annealing.

In the present embodiment, laser irradiation intensity here is adjusted to such a condition that arithmetic mean roughness (Ra) of surface S2 of second electrode 120 formed on first electrode 110 in a next step (S106) is not greater than 0.2 μm. Thus, generation of voids during die bonding can be suppressed. Description will be given below with reference to specific results in experiments.

1 Relation Between Surface Roughness of Second Electrode and Void Occupancy

Initially, relation between surface roughness of second electrode 120 and a void occupancy during die bonding will be described. Here, a "void occupancy" represents a ratio (a percentage) of an area occupied by voids to an area of a portion of mount (solder) of SiC semiconductor device 101 and a support (not shown) in an image obtained by image pick-up of the mount portion with an X-ray microscope and subjecting the obtained transmission image to binary processing.

Figure 7:
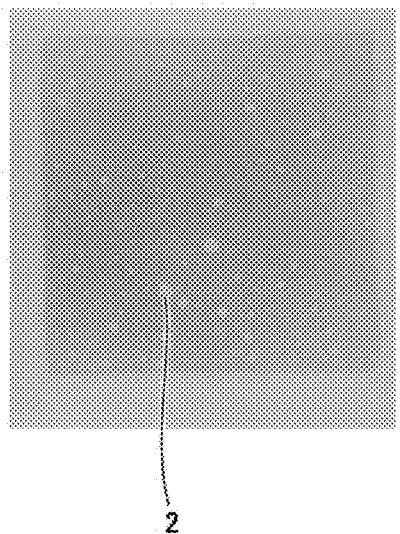
FIG. 7 is a diagram showing one example of a situation of generation of voids during die bonding.
Figure 8:
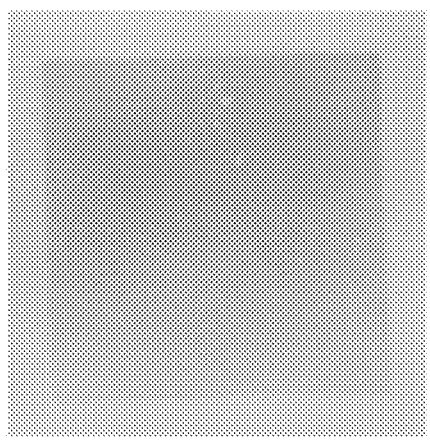
FIG. 8 is a diagram showing another example of a situation of generation of voids during die bonding.

FIGS. 7 and 8 are image pick-up examples of the mount portion with the X-ray microscope. These images have a range of 220 μm×280 μm. In these image pick-up examples, a laser scan period during laser annealing is set to 50 to 60 μm. Therefore, it can be concluded that these image pick-up examples are obtained by image pick-up over a range covered during 3 to 4 scan periods. In FIGS. 7 and 8, presence of voids 2 can be observed in the mount portion. Here, a void occupancy in FIG. 7 is approximately 7%, while a void occupancy in FIG. 8 is approximately 2%. According to the studies conducted by the present inventor, it has been found that such a void occupancy exceeding 5% is insufficient for practical use. Therefore, the void occupancy should be controlled to 5% or lower.

Figure 9:
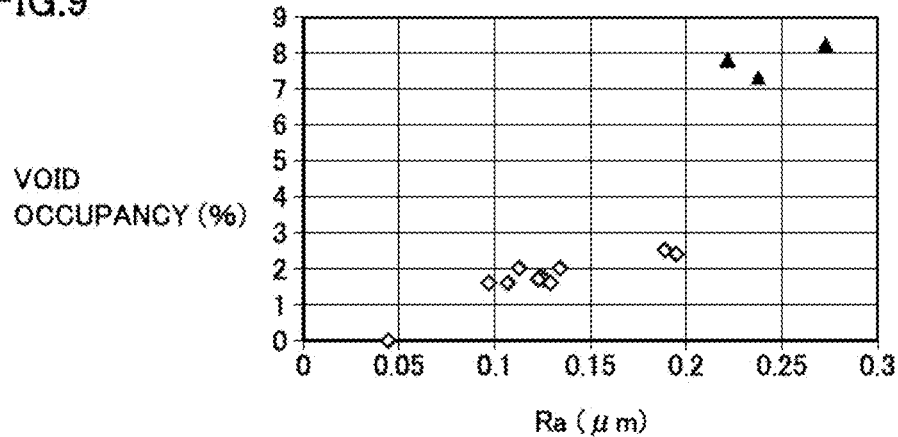
FIG. 9 is a graph showing one example of relation between arithmetic mean roughness (Ra) of a surface of a second electrode and a void occupancy during die bonding.

1-A. Relation Between Arithmetic Mean Roughness (Ra) of Surface of Second Electrode and Void Occupancy FIG. 9 is a graph showing relation between arithmetic mean roughness (Ra) of surface S2 of second electrode 120 and a void occupancy. In FIG. 9, the ordinate represents a void occupancy of the mount portion and the abscissa represents arithmetic mean roughness (Ra) of surface S2 of second electrode 120. In FIG. 9, a mark in a rhombic shape represents a good product of which void occupancy is not higher than 5% and a mark in a triangular shape represents a defective product of which void occupancy exceeds 5%.

Strong correlation between arithmetic mean roughness (Ra) and a void occupancy can be observed in FIG. 9. In FIG. 9, as arithmetic mean roughness (Ra) is greater, a void occupancy increases, and when arithmetic mean roughness (Ra) exceeds 0.2 μm, a void occupancy drastically increases and exceeds 5%. Therefore, it can be concluded based on this result that arithmetic mean roughness (Ra) of surface S2 of second electrode 120 should be controlled to 0.2 μm or lower. It can be concluded based on FIG. 9 that, in consideration of further lowering in void occupancy, arithmetic mean roughness (Ra) of surface S2 of second electrode 120 is preferably not greater than 0.15 μm and more preferably not greater than 0.1 μm.

Figure 10:
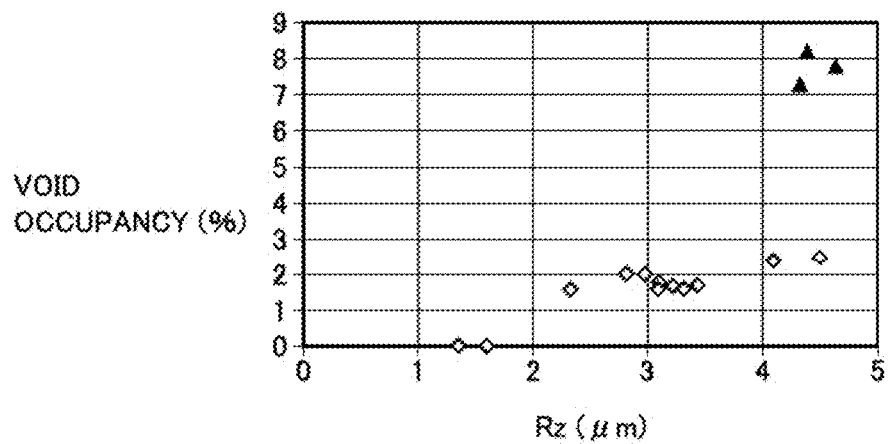
FIG. 10 is a graph showing one example of relation between a maximum height (Rz) of the surface of the second electrode and a void occupancy during die bonding.

1-B. Relation Between Maximum Height (Rz) of Surface of Second Electrode and Void Occupancy FIG. 10 is a graph showing relation between a maximum height (Rz) of surface S2 of second electrode 120 and a void occupancy. Here, the "maximum height (Rz)" represents a maximum height (Rz) defined under "JIS B 0601:2001" In FIG. 10, the ordinate represents a void occupancy of the mount portion and the abscissa represents a maximum height (Rz) of surface S2 of second electrode 120. In FIG. 10, a mark in a rhombic shape represents a good product of which void occupancy is not higher than 5% and a mark in a triangular shape represents a defective product of which void occupancy exceeds 5%.

In FIG. 10, in a region where the maximum height (Rz) is not smaller than 4 μm, a void occupancy not higher than 5% and a void occupancy exceeding 5% are both present. Therefore, it can be concluded that correlation between the maximum height (Rz) of surface S2 of second electrode 120 and a void occupancy is not so strong. This is considered to result from such a difference that the maximum height (Rz) represents a local value representing only a difference between a maximum profile peak height and a maximum profile valley depth within a measurement area whereas a void occupancy represents an average value for the mount portion as a whole.

Figure 11:
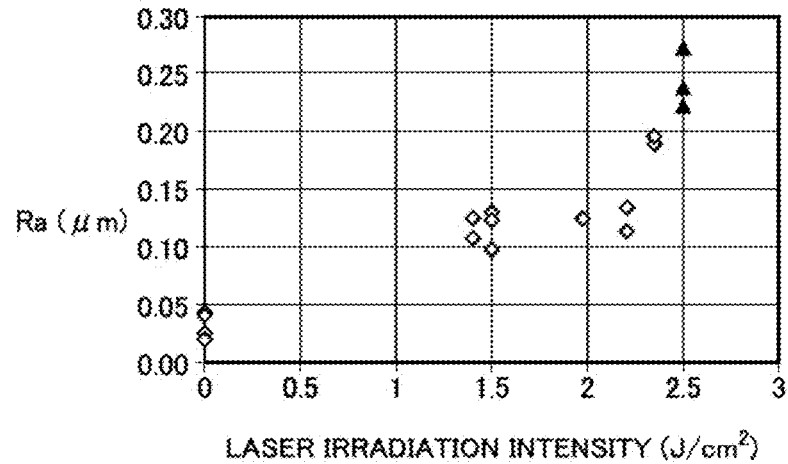
FIG. 11 is a graph showing one example of relation between laser irradiation intensity in the laser annealing step and arithmetic mean roughness (Ra) of the surface of the second electrode.

2. Relation Between Laser Irradiation Intensity and Arithmetic Mean Roughness (Ra) of Surface of Second Electrode Relation between laser irradiation intensity in the laser annealing step (S105) and arithmetic mean roughness (Ra) of surface S2 of second electrode 120 subsequently formed on first electrode 110 will now be described. FIG. 11 is a graph showing relation between laser irradiation intensity and arithmetic mean roughness (Ra) of surface S2 of second electrode 120. In FIG. 11, the ordinate represents arithmetic mean roughness (Ra) of surface S2 of second electrode 120 and the abscissa represents laser irradiation intensity. In FIG. 11, a mark in a rhombic shape represents a good product of which void occupancy is not higher than 5% and a mark in a triangular shape represents a defective product of which void occupancy exceeds 5%.

In FIG. 11, a point where laser irradiation intensity is 0 (zero) represents arithmetic mean roughness (Ra) of second electrode 120 in a case that ohmic contact is established through lamp annealing. It can be seen in FIG. 11 that laser annealing for establishing ohmic contact is greater in arithmetic mean roughness (Ra) than lamp annealing. By further increasing laser irradiation intensity, arithmetic mean roughness (Ra) gradually becomes greater, arithmetic mean roughness drastically becomes greater from around a point where laser irradiation intensity exceeds 2.2 J/cm$^2$, and arithmetic mean roughness (Ra) exceeds 0.2 μm when laser irradiation intensity reaches 2.5 J/cm$^2$. It can be seen based on this result that arithmetic mean roughness (Ra) of surface S2 of second electrode 120 can be controlled by controlling laser irradiation intensity.

As described previously, in order to suppress a void occupancy to 5% or lower, arithmetic mean roughness (Ra) of surface S2 of second electrode 120 should be controlled to 0.2 μm or lower. As shown in FIG. 11, in the present result, laser irradiation intensity allowing control of arithmetic mean roughness (Ra) to 0.2 μm or lower is up to 2.4 J/cm$^2$. Therefore, laser irradiation intensity is preferably not higher than 2.4 J/cm$^2$, although depending on composition of first electrode 110. In consideration of further decrease in arithmetic mean roughness (Ra), laser irradiation intensity is more preferably not higher than 2.2 J/cm$^2$ and particularly preferably not higher than 2.0 J/cm$^2$.

In consideration of formation of sufficient ohmic contact, on the other hand, laser irradiation intensity is desirably not lower than 1.5 J/cm$^2$, although depending on composition of first electrode 110. Namely, laser irradiation intensity is preferably not lower than 1.5 J/cm$^2$ and not higher than 2.4 J/cm$^2$, more preferably not lower than 1.5 J/cm$^2$ and not higher than 2.2 J/cm$^2$, and particularly preferably not lower than 1.5 J/cm$^2$ and not higher than 2.0 J/cm$^2$.

Here, laser beams desirably have a wavelength corresponding to a band gap of SiC (for example, 386 nm or shorter). Thus, laser beams are more likely to be absorbed by the surface of SiC substrate 100 and energy efficiency is improved. For example, laser beams having a wavelength of 355 nm, which are third harmonics of YAG laser or YVO$_4$ laser, can be employed as laser beams having such a wavelength. Laser beams have a pulse width, for example, not shorter than 10 ns and not longer than 10 μs and preferably not shorter than 50 ns and not longer than 1 μs. Thus, annealing can be carried out in a short period of time while using a practical pulse width.

[Second Electrode Forming Step (S106)]

Figure 5:
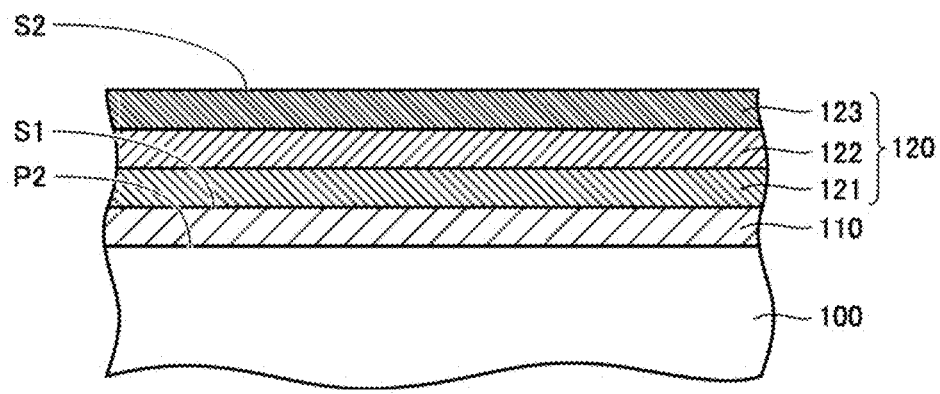
FIG. 5 is a schematic partial cross-sectional view illustrating a second electrode forming step according to one embodiment of the present disclosure.

FIG. 5 is a schematic partial cross-sectional view illustrating the second electrode forming step (S106). In the second electrode forming step (S106), second electrode 120 is formed. Second electrode 120 is formed on first electrode 110 subjected to the laser annealing step (S105). Second electrode 120 can be formed, for example, with sputtering or vacuum vapor deposition. Second electrode 120 has a thickness, for example, approximately from 300 to 900 nm.

An element forming second electrode 120 can be exemplified by Ti, Ni, platinum (Pt), and Au. Second electrode 120 preferably contains Ti, Ni, and Au among them. Thus, electrical resistance can be lowered.

Second electrode 120 may be composed of a single element or of a plurality of elements. Referring further to FIG. 5, second electrode 120 may include a plurality of layers. In FIG. 5, second electrode 120 includes first layer 121 containing Ti, second layer 122 containing Ni, and third layer 123 containing Au. By adopting such a stack structure, electrical resistance tends to be low. Though a thickness of each layer is not particularly restricted, the thickness is set, for example, to approximately 100 to 300 nm. Second electrode 120 may contain an impurity inevitably introduced during formation.

As above, SiC semiconductor device 101 representing a vertical MOSFET having a planar structure is manufactured. As described previously, in SiC semiconductor device 101, arithmetic mean roughness (Ra) of surface S2 of second electrode 120 is controlled to 0.2 μm or lower, and hence a void occupancy can be suppressed, for example, to 5% or lower during die bonding of SiC semiconductor device 101.

Though the present embodiment has been described with reference to a MOSFET by way of example, the present embodiment is not limited thereto and can widely be applied to a silicon carbide semiconductor device such as an insulated gate bipolar transistor (IGBT) or a Schottky barrier diode (SBD). The silicon carbide semiconductor device may have not only a planar structure but also a trench structure.

Although the present disclosure has been described and illustrated in detail, it is clearly understood that the same is by way of illustration and example only and is not to be taken by way of limitation, the scope of the present disclosure being interpreted by the terms of the appended claims.

What is claimed is:

1. A method of manufacturing a silicon carbide semiconductor device, comprising the steps of:
    preparing a silicon carbide substrate;
    forming a first electrode on said silicon carbide substrate;
    establishing ohmic contact between said silicon carbide substrate and said first electrode by irradiating said first electrode with laser beams; and
    forming a second electrode on said first electrode,
    in said step of establishing ohmic contact, a surface of said first electrode being irradiated with laser beams such that arithmetic mean roughness of a surface of said second electrode is not greater than 0.2 μm.

2. The method of manufacturing a silicon carbide semiconductor device according to claim 1, wherein
    said first electrode contains nickel.

3. The method of manufacturing a silicon carbide semiconductor device according to claim 1, wherein
    said second electrode contains gold.

4. The method of manufacturing a silicon carbide semiconductor device according to claim 1, wherein
    said second electrode includes a plurality of layers, and
    said plurality of layers include a first layer containing titanium, a second layer containing nickel, and a third layer containing gold.

5. The method of manufacturing a silicon carbide semiconductor device according to claim 1, further comprising, before said step of forming a first electrode, the steps of;
    grinding a main surface of said silicon carbide substrate on which said first electrode is to be formed; and
    removing a damaged layer by etching ground said main surface, wherein
    in said step of establishing ohmic contact, the surface of said first electrode is irradiated with laser beams at laser irradiation intensity not lower than 1.5 J/cm$^2$ and not higher than 2.4 J/cm$^2$.

6. The method of manufacturing a silicon carbide semiconductor device according to claim 1, wherein
    said first electrode contains silicon.

* * * * *